US 6,693,870 B2

(12) United States Patent
Koga et al.

(10) Patent No.: US 6,693,870 B2
(45) Date of Patent: Feb. 17, 2004

(54) OPTICAL PICKUP DEVICE WITH HIGH-FREQUENCY SUPERPOSITION CIRCUIT

(75) Inventors: Mio Koga, Takatsuki (JP); Satoshi Takimoto, Takatsuki (JP); Tatsuya Ito, Osaka (JP)

(73) Assignee: Funai Electric Co., Ltd., Daito (JP)

( * ) Notice: Subject to any disclaimer, the term of this patent is extended or adjusted under 35 U.S.C. 154(b) by 423 days.

(21) Appl. No.: 09/742,253

(22) Filed: Dec. 20, 2000

(65) Prior Publication Data

US 2001/0004347 A1 Jun. 21, 2001

(30) Foreign Application Priority Data

Dec. 21, 1999 (JP) .......................................... 11-009661

(51) Int. Cl.[7] .................................................. G11B 7/00
(52) U.S. Cl. ...................................... 369/116; 369/44.14
(58) Field of Search .......................... 369/44.11, 44.14, 369/44.15, 75.1, 44.16, 116

(56) References Cited

U.S. PATENT DOCUMENTS 6,141,309 A  * 10/2000  Saitou et al. ............... 369/75.1

FOREIGN PATENT DOCUMENTS

| JP | 2-44593 | 2/1990 |
| JP | 2-144194 | 12/1990 |
| JP | 4-321943 | 11/1992 |
| JP | 6-268385 | 9/1994 |
| JP | 7-263807 | 10/1995 |
| JP | 8-124201 | 5/1996 |
| JP | 9-63088 | 3/1997 |
| JP | 9-198689 | 7/1997 |
| JP | 10-134412 | 5/1998 |
| JP | 11-025489 | 1/1999 |
| JP | 11-144283 | 5/1999 |

* cited by examiner

Primary Examiner—Nabil Hindi (57) ABSTRACT

In an optical pickup device employing a high-frequency superposition method, a high-frequency superposition circuit is mounted on an FPC. With this arrangement, the number of steps for attaching printed boards may be reduced and improvements in workability of assembly achieved. By electrically connecting a conductive plated surface that is conductive with a GND pattern formed on a projecting portion of the FPC with a conductive plated surface of a reinforcing plate, the GND pattern may be connected to a wide GND at a short distance, and actions of restricting extraneous emission may be improved.

12 Claims, 6 Drawing Sheets

OPTICAL PICKUP DEVICE WITH HIGH-FREQUENCY SUPERPOSITION CIRCUIT

BACKGROUND OF THE INVENTION

The present invention relates to an optical pickup device for optically performing recording and/or reproduction of information on various recording media such as CDs (compact disks), DVDs (digital video disks), or MDs (mini disks), and particularly to a device including a high-frequency superposition circuit for performing high-frequency driving of light sources such as laser diodes or the like.

It was conventionally the case with optical pickup devices that when performing recording and reproduction using laser beams obtained by emitting light through semiconductor laser (hereinafter referred to as "laser diode"), light reflected by optical disks would be returned to the laser diode while such returned light would cause turbulence in modes of the laser diode and lead to generation of noises in signals. For preventing generation of such noise, it is known to employ a high-frequency superposition method for driving the laser diode upon supply of high-frequency current. While devices employing such a method comprise a high-frequency superposition circuit, leakage of oscillating frequency components of the high-frequency superposition circuit to the exterior will result in extraneous emission.

There are known arrangements including measures for preventing such extraneous emission in which the laser diode and the high-frequency superposition circuit are enclosed by a shielding case with a GND (grounding) pattern of this circuit being electrically connected to the shielding case in a direct manner, or in which a line connected to the circuit is drawn out to the exterior from the shielding case, wherein a capacitor is connected to between the line and the GND proximate to a drawing outlet for the line from the shielding case (see, for instance, Japanese Patent Unexamined Publication No. 11-144283 (1999), Japanese Patent Unexamined Publication No. 6-268385 (1994), or Japanese Patent Unexamined Publication No. 9-63088(1997).

However, it is the case with the above-described conventional optical pickup devices employing the high-frequency superposition method that an FPC (flexible printed circuit board), on which a connector for connecting cables for connecting the optical pickup and a control circuit on a set side and a peripheral circuit are provided, is formed as a separated board from a printed board for the high-frequency superposition circuit, and the high-frequency superposition circuit is formed on a small printed circuit. This would lead to increased costs owing to an increase in the number of operating steps and to poor workability of assembly. Moreover, while it is necessary to connect the GND of the high-frequency superposition circuit to a wide and stable GND at a shortest possible wiring distance in order to prevent extraneous emission, the distance was conventionally long and emission was hard to be reduced to a satisfactory level.

SUMMARY OF THE INVENTION

The present invention has been made for solving these problems, and it is an object of the present invention to provide an optical pickup device employing a high-frequency superposition method wherein the high-frequency superposition circuit is not provided on a separate printed board other than the FPC that is provided with a connector but is formed on the FPC to thereby decrease the number of operating steps, enable favorable workability of assembly, and thus to achieve decreases in costs. It is another object to provide an optical pickup device with which a GND of the high-frequency superposition circuit can be connected to a wide and stable GND at a short wiring distance to thereby achieve satisfactory effects of preventing extraneous emission.

BRIEF DESCRIPTION OF THE DRAWINGS

FIG. 4($a$) is a front view, FIG. 4($b$) a side sectional view, and FIG. 4($c$) is a rear view showing structures during assembly of the above FPC.

FIG. 5($a$) is a front view, FIG. 5($b$) a side sectional view, and FIG. 5($c$) is a rear view showing structures after assembly of the above FPC.

FIG. 6($a$) is a front view, FIG. 6($b$) a side sectional view, and FIG. 6($c$) is a rear view showing structures during assembly of an FPC according to another embodiment.

FIG. 7($a$) is a front view, FIG. 7($b$) is a side sectional view, and FIG. 7($c$) is a rear view showing structures after assembly of the FPC according to another embodiment.

DETAILED DESCRIPTION OF THE PREFERRED EMBODIMENT OF THE PRESENT INVENTION

Figure 1:
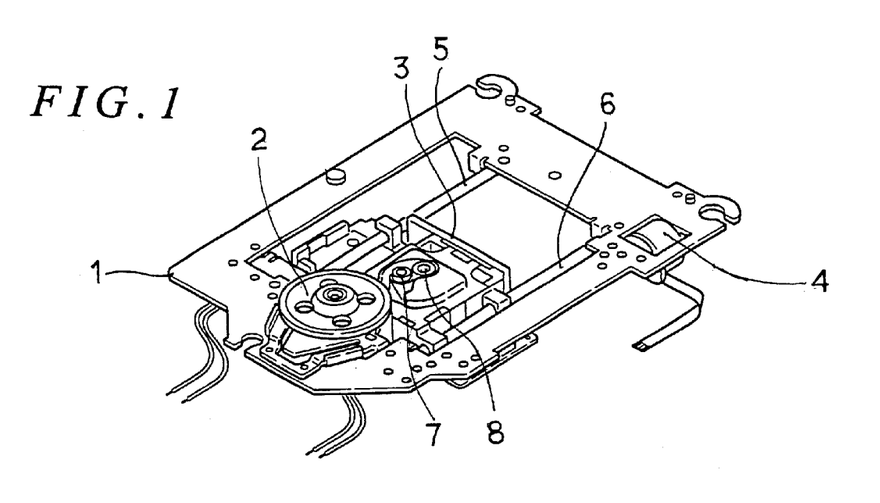
FIG. 1 is a perspective view of a deck chassis portion of a set to which the optical pickup device according to one embodiment of the present invention is applied.

One embodiment of the present invention will now be explained with reference to the drawings. The optical pickup device according to the present embodiment is applied to a set for optically performing recording and/or reproduction of information on optical disks such as CDs and DVDs. FIG. 1 illustrates a deck chassis portion of the set. The deck chassis 1 is provided with a turntable 2 for rotatably driving optical disks, and an optical pickup device 3 for performing operations such as reading information of the optical disks. The optical pickup device 3 comprises lenses 7 and 8 which are switchable to correspond to either CDs or DVDs, and which are supported by guiding axes 5 and 6 so that the lenses may perform sliding movements when being driven by a motor 4.

Figure 2:
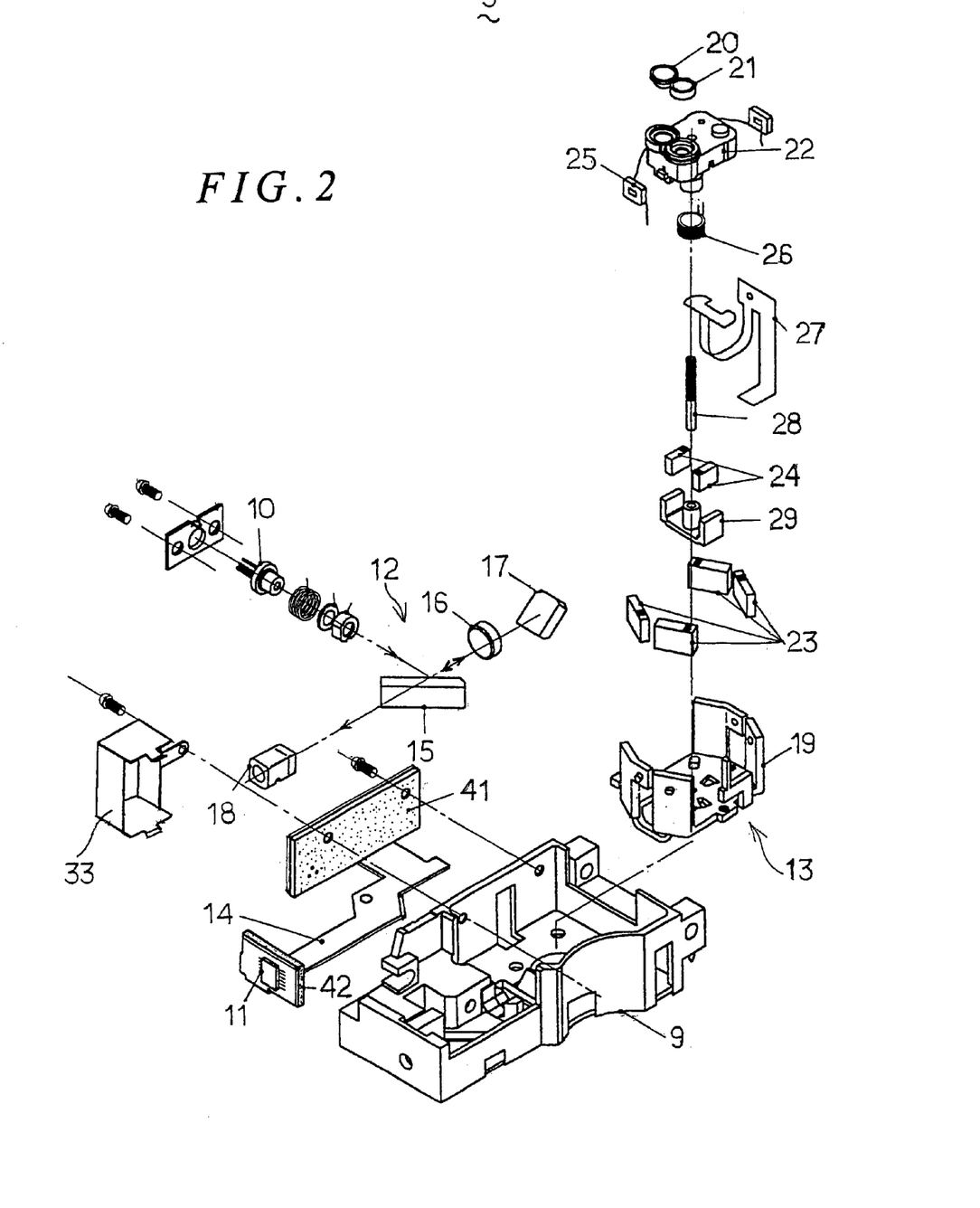
FIG. 2 is an exploded perspective view of the above optical pickup device.

FIG. 2 is an exploded view of the optical pickup device 3. The optical pickup device 3 is provided with a conductive metallic base block 9, wherein the base block 9 is mounted with a laser diode (light source) 10, an optical element 12 composing an optical system for introducing light reflected by the optical disks to a photo diode (light-receiving means) 11, a lens block 13 for performing switching between lenses, and an FPC (flexible printed circuit board) 14 composing a peripheral circuit for the laser diode 10 and the photo diode 11. The photo diode 11 converts received optical signals into electric signals. The optical element 12 comprises a half mirror 15, collimating lens 16, a mirror 17, and a sensor lens 18 and other members. The lens block 13 holds a base 19, a lens holder 22 for holding a DVD lens 20 and a CD lens 21 that may be rotated for switching, a tracking magnet 23, a focusing magnet 24, a tracking coil 25, a focusing coil 26, an FPC 27, a supporting shaft 28, a shaft base 29 and other members. A high-frequency superposition circuit 35 (illustrated in FIG. 3 as will be explained later) for driving the laser diode 10 through high-frequency superposition method is mounted onto the FPC 14 without employing a separated printed board. An HF shielding cover 33 is fixed onto the base block 9 as to cover the high-frequency superposition circuit 35 for preventing extraneous emission.

In the above-described optical pickup device 3, laser beam emitted from the laser diode 10 is reflected by the half mirror 15 and is irradiated onto an optical disk by the lens 20 or 21 through the collimating lens 16 and mirror 17, while light reflected by the optical disk passes through the half mirror 15 through the mirror 17 and the collimating lens 16 and is introduced to the photo diode 11 through the sensor lens 18. In this manner, operations such as reading information of the optical disk may be performed.

Figure 3:
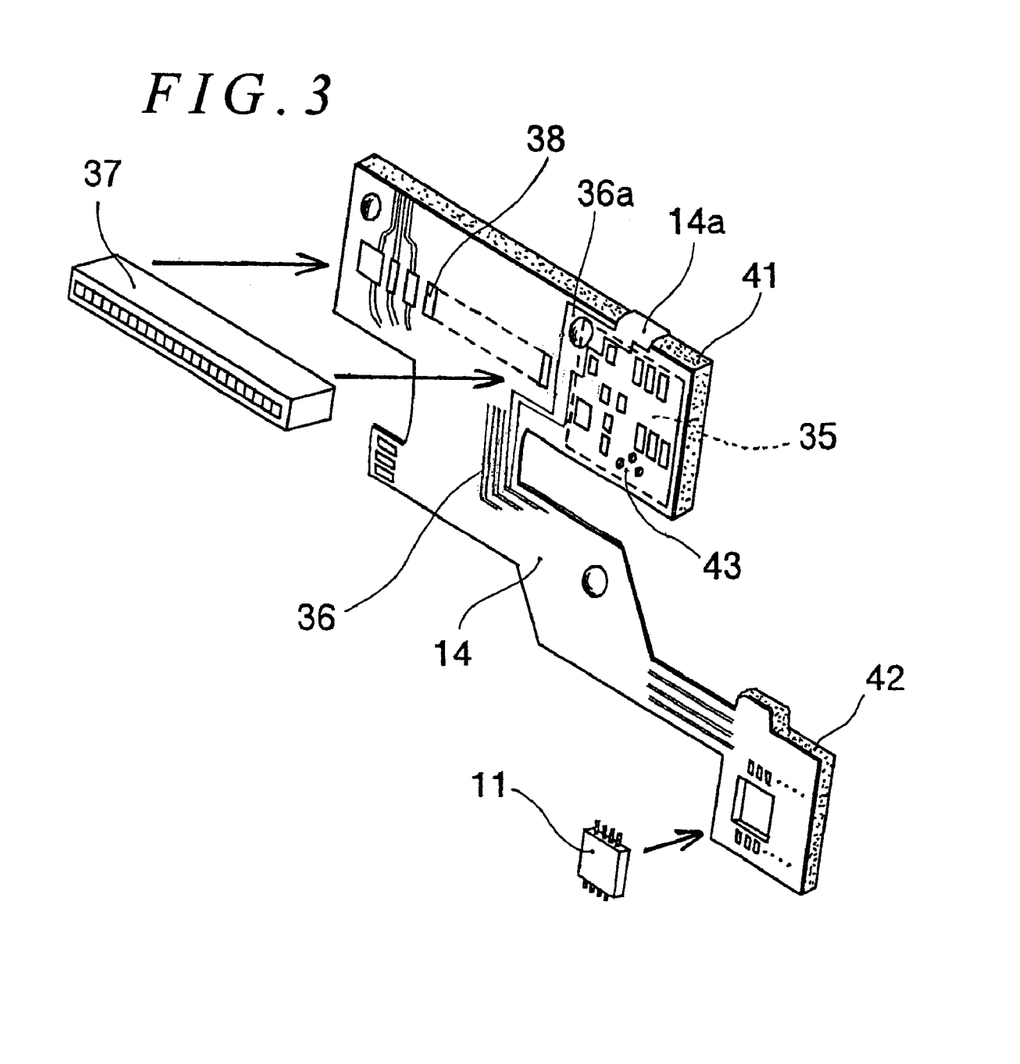
FIG. 3 is a perspective view of an FPC employed in the above optical pickup device.

The arrangement of the FPC 14 will now be explained by further referring to FIG. 3. The FPC 14 is provided with a peripheral circuit 36 for signals for driving the laser diode 10, the high-frequency superposition circuit 35 (illustrated with mounted parts being omitted) and lenses as well as inputting and outputting signals from the photo diode 11, and a connector terminal 38 for mounting a connector 37 that is connected through cables to a control circuit (not shown) on the set side. The connector terminal 38 and terminals for connecting various parts such as the photo diode 11 are formed by conductive plating. The connector 37 and various parts are soldered to these terminals. The peripheral circuit 36 further includes a GND (grounding) pattern 36a. Resin reinforcing plates 41 with a conductive plated surface 46 being formed on a rear surface thereof and aluminum reinforcing plates 42 are adhered to a part of the FPC 14. The FPC 14 is adhered and fastened through screwing to extend over a bottom surface and two side surfaces of the base block 9 with the reinforcing plates 41 and 42 being interposed on the side surfaces. It should be noted that the high-frequency superposition circuit 35 is further provided with a terminal for connecting a lead of the laser diode 10 and holes 43.

As explained so far, according to the present embodiment, the high-frequency superposition circuit 35 is mounted on the FPC 14 without employing a separate printed board other than the FPC so that the number of process steps for attaching such a printed board may be decreased to thereby improve workability of assembly.

The arrangement of the FPC 14 devised to prevent extraneous emission will now be explained by further referring to FIGS. 4(a)–(c) and 5(a)–(c). The FPC 14 is formed with a projecting portion 14a that forms an extension of a GND pattern 36a and partially projects outward of the FPC 14, wherein a surface of this projecting portion 14a is cover-laid opened and is formed with a conductive plated pattern 45 that is conductive with the GND pattern 36a. Conductive plated surfaces 46 are also formed on the reinforcing plates 41 that are adhered to a part of the FPC 14, on a surface opposite to its surface at which it is adhered (i.e. rear surface). The FPC 14 is disposed such that the conductive plated surfaces 46 are opposing or abutting the base block 9. The conductive plated surfaces 46 has a size that is equal to that of the respective reinforcing plates 41, and has a surface area that is larger than an ordinary GND pattern formed on the FPC 14. It should be noted that no conductive plated surface 46 is formed on rear surface portions 47 of the reinforcing plates 41 corresponding to the lead-connecting terminals and holes 43 of the laser diode 10 of the FPC 14.

Figure 4A:
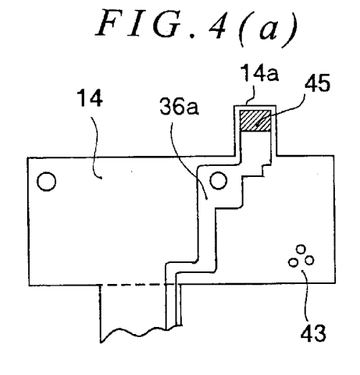
Figures 4B, 4C:
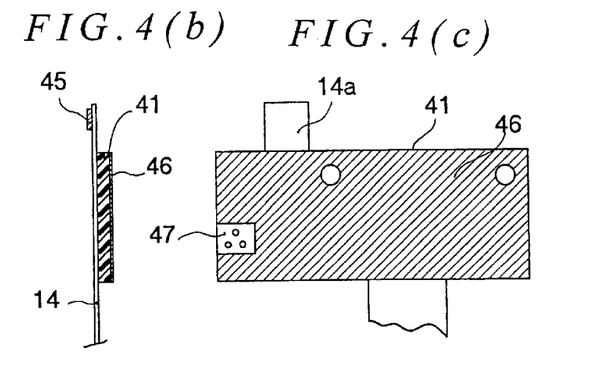
Figure 5A:
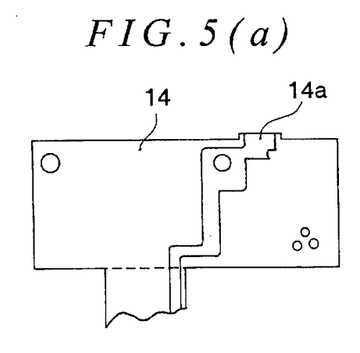
Figures 5B, 5C:
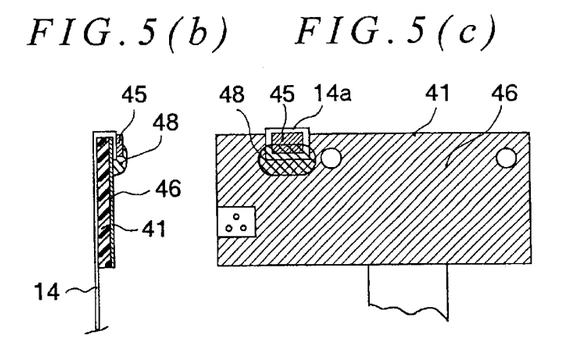

As illustrated in FIGS. 4(a)–(c), the projecting portion 14a of the FPC 14 is in a condition projecting outward of the reinforcing plates 41 during assembly. A both-sided adhesive sheet (not shown) is adhered onto a rear surface side of the projecting portion 14a, and the projecting portion 14a of the FPC 14 is bent to the rear surface side of the reinforcing plates 41 from a condition as illustrated in FIGS. 4(a)–4(c) to that as illustrated in FIGS. 5(a)–5(c) to be held by the both-sided adhesive sheet, and the conductive plated pattern 45 and the conductive plated surfaces 46 of the reinforcing plates 41 are electrically conducted through soldering 48. In this manner, the GND pattern 36a may be electrically connected to the conductive plated surfaces 46 of the reinforcing plates 41, which have a relatively wide surface area, by means of remarkably short wiring to thereby achieve a stable GND. It is accordingly possible to restrict extraneous emission and to achieve noise reducing effects (approximately −10 dB). Particularly in a form in which the high-frequency superposition circuit 35 is mounted on the FPC 14 without employing a separate printed board, the cable run length may be reduced and a stable GND obtained through short wiring, and effects for restricting extraneous emission become remarkable.

Figure 8:
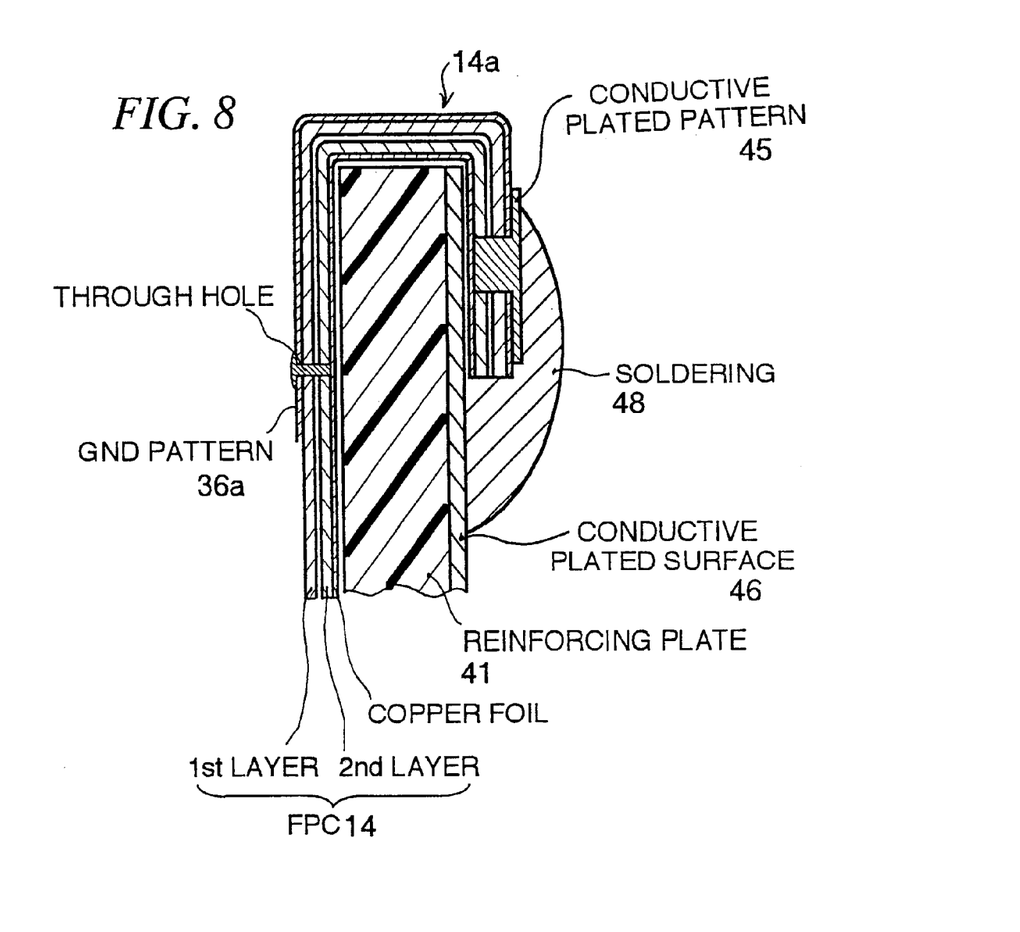
FIG. 8 is an enlarged sectional view of FIG. 5($b$).

The FPC 14 may alternatively be arranged to be of two-layered structure wherein a peripheral circuit pattern mounting parts thereon and the GND pattern 36a are formed on a first layer while a copper foil (not shown) is formed to substantially cover an entire surface of a second layer. In this arrangement, the peripheral circuit pattern of the first layer and the copper foil surface of the second layer are electrically connected by means of a through hole structure, and the GND pattern 36a of the first layer is similarly electrically connected to the copper foil surface of the second layer. With this arrangement, GND connection may be achieved at a shortest distance without routing wiring from the peripheral circuit pattern to the GND pattern 36a, and the above-described actions and effects may remarkably be achieved. FIG. 8 illustrates an enlarged view of FIG. 5(b).

Figure 6A:
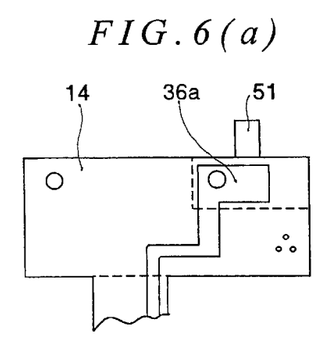
Figures 6B, 6C:
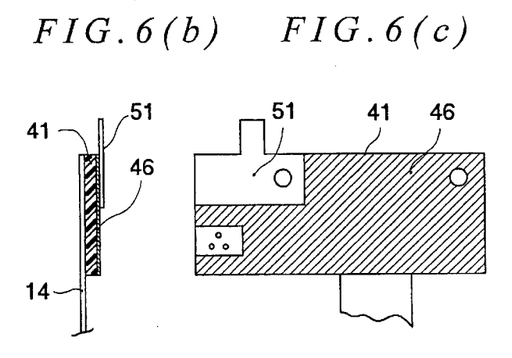
Figure 7A:
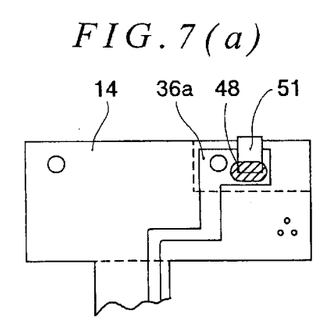
Figures 7B, 7C:
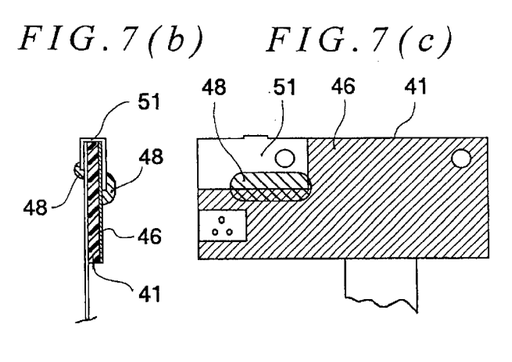

Another embodiment of the FPC will now be explained with reference to FIGS. 6(a)–(c) and 7(a)–7(c). In this illustrated embodiment, no projecting portion 14a is provided on the FPC 14 but a copper foil sheet 51 is employed instead. Similarly to the above-described case, reinforcing plates 41 formed with conductive plated surfaces 46 on a rear surface thereof are adhered onto an FPC 14 formed with a GND pattern 36a (wherein a shape of the pattern is illustrated in a simplified manner). Further, a copper foil sheet 51 is adhered to the conductive plated surfaces 46 of the reinforcing plates 41 by using a both-sided adhesive sheet as illustrated in FIGS. 6(a)–6(c), a convex portion of the copper foil sheet 51 is bent to the GND pattern 36a side of the FPC 14 as illustrated in FIGS. 7(a)–7(c), and electric conduction is applied through soldering 48 between the copper foil sheet 51 and the conductive plated surfaces 46 and between the copper foil sheet 51 and the GND pattern 36a.

This arrangement is also capable of connecting the GND pattern 36a of the FPC 14 to a wide and stable GND through extremely short wiring, and it is possible to restrict extraneous emission similarly to the above-described case.

It should be noted that the present invention might be altered in various ways without being limited to the arrangements of the above embodiments. For instance, shapes of the GND pattern 36a of the FPC 14 or shapes of the conductive plated surfaces 46 of the reinforcing plates 41 are applicable to arbitrary embodiments.

As explained so far, since the optical pickup device employing a high-frequency superposition method of the present invention is arranged to mount a high-frequency superposition circuit on an FPC provided with a connector, the number of steps for attaching printed boards may be reduced and improvements in workability of assembly achieved when compared to a case in which the high-frequency superposition circuit is provided on a separate printed board.

By employing an arrangement in which reinforcing plates with a conductive plated surface being formed on a rear surface thereof are adhered to an FPC that is formed with a conductive plated surface which is conductive with a GND pattern, or with a copper foil sheet to project outward thereof, and in which both conductive plated surfaces are electrically connected, the GND of the high-frequency superposition circuit may be connected to a wide and stable GND comprised by the conductive plated surfaces of the reinforcing plates at an extremely short wiring distance, and effects of restricting extraneous emission may be improved.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. An optical pickup device, comprising:
   a light source for irradiating light onto an optical disk,
   a light-receiving means for receiving light reflected by the optical disk and converting received optical signals into electric signals,
   a high-frequency superposition circuit for driving the light source by using a high-frequency superposition method,
   a flexible printed circuit board (referred to as "FPC") including a circuit and a connector for input and output of signals for driving said light source and the high-frequency superposition circuit as well as signals from said light-receiving means, and
   a reinforcing plate with a conductive plated surface being formed on a rear surface thereof, wherein:
      said high-frequency superposition circuit is mounted on said FPC,
      said FPC is further formed with a grounding (referred to as "GND") pattern and a projecting portion projecting outward of the FPC, and with a conductive plated pattern being formed on a surface of the projecting portion to be conductive with the GND pattern, and
      a rear surface of said FPC is adhered to surfaces of said reinforcing plate, the projecting portion of the FPC is bent, and the conductive plated pattern is electrically connected to the conductive plated surface of said reinforcing plate.

2. An optical pickup device, comprising:
   a light source for irradiating light onto an optical disk,
   a light-receiving means for receiving light reflected by the optical disk and converting received optical signals into electric signals,
   a high-frequency superposition circuit for driving the light source by using a high-frequency superposition method,
   a flexible printed circuit board (referred to as "FPC") including a circuit and a connector for input and output of signals for driving said light source and the high-frequency superposition circuit as well as signals from said light-receiving means, and
   a reinforcing plate with a conductive plated surface being formed on a rear surface thereof, wherein:
      said high-frequency superposition circuit is mounted on said FPC,
      said FPC is further formed with a grounding (referred to as "GND") pattern,
      a rear surface of said FPC is adhered to surfaces of said reinforcing plates and is electrically connected therewith, and
      a copper foil sheet is adhered onto the conductive plated surface of said reinforcing plate, and a projecting portion of a part of the sheet is bent and electrically connected to the GND pattern of said FPC.

3. An optical pickup device, comprising:
   a light source for irradiating light onto an optical disk,
   a light-receiving means for receiving light reflected by the optical disk and converting received optical signals into electric signals,
   a high-frequency superposition circuit for driving the light source by using a high-frequency superposition method, and
   a flexible printed circuit board (referred to as "FPC") including a circuit and a connector for input and output of signals for driving said light source and the high-frequency superposition circuit as well as signals from said light-receiving means, wherein
      said high-frequency superposition circuit is mounted on said FPC, and
      said FPC is of two-layered structure with a wiring circuit with parts being mounted thereon and the GND pattern are formed on a first layer while a copper foil surface is formed on a second layer.

4. An optical pickup device, comprising:
   a light source for irradiating light onto an optical disk,
   a light-receiving means for receiving light reflected by the optical disk and converting received optical signals into electric signals,
   a high-frequency superposition circuit for driving the light source by using a high-frequency superposition method, and a flexible printed circuit board (referred to as "FPC") including a circuit and a connector for input and output of signals for driving said light source and the high-frequency superposition circuit as well as signals from said light-receiving means, wherein:
      said high-frequency superposition circuit is mounted on said FPC, and
      said optical pickup device includes a conductive metallic base block, and wherein said high-frequency superposition circuit is covered by an HF shielding cover that is fixed to said base block.

5. The optical pickup device as claimed in claim 1, wherein said FPC is fixed to an outer surface of said base block with said reinforcing plate being interposed between.

6. The optical pickup device as claimed in claim 2, wherein said FPC is fixed to an outer surface of said base block with said reinforcing plate being interposed between.

7. An optical pickup device, comprising:
   a light source for irradiating light onto an optical disk,
   a light-receiving means for receiving light reflected by the optical disk and converting received optical signals into electric signals,
   a high-frequency superposition circuit for driving the light source by using a high-frequency superposition method, a flexible printed circuit board (referred to as "FPC") including a circuit and a connector for input and output of signals for driving said light source and the high-frequency superposition circuit as well as signals from the light-receiving means, and a reinforcing plate with a conductive plated surface being formed on a rear surface thereof, wherein:

the optical pickup device includes a conductive metallic base block, wherein said light source, said light-receiving means and said FPC are held by the base block, and wherein said high-frequency superposition circuit is mounted on said FPC, said FPC is further formed with a grounding (referred to as "GND") pattern and a projecting portion projecting outward of the FPC, and with a conductive plated pattern being formed on a surface of the projecting portion to be conductive with the GND pattern, and a rear surface of said FPC is adhered to the surface of said reinforcing plate, the projecting portion of the FPC is bent, and the conductive plated pattern is electrically connected to the conductive plated surface of said reinforcing plate.

8. An optical pickup device, comprising:

a light source for irradiating light onto an optical disk, a light-receiving means for receiving light reflected by the optical disk and converting received optical signals into electric signals, a high-frequency superposition circuit for driving the light source by using a high-frequency superposition method, a flexible printed circuit board (referred to as "FPC") including a circuit and a connector for input and output of signals for driving said light source and the high-frequency superposition circuit as well as signals from the light-receiving means, and a reinforcing plate with a conductive plated surface being formed on a rear surface thereof, wherein:

the optical pickup device includes a conductive metallic base block, wherein said light source, said light-receiving means and said FPC are held by the base block, and wherein said high-frequency superposition circuit is mounted on said FPC, said FPC is further formed with a grounding (referred to as "GND") pattern, a rear surface of said FPC is adhered to the surface of said reinforcing plate and is electrically connected therewith, and a copper foil sheet is adhered onto the conductive plated surface of said reinforcing plate, and a projecting portion of a part of the sheet is bent and electrically connected to the GND pattern of said FPC.

9. An optical pickup device, comprising:

a light source for irradiating light onto an optical disk, a light-receiving means for receiving light reflected by the optical disk and converting received optical signals into electric signals, a high-frequency superposition circuit for driving the light source by using a high-frequency superposition method, and a flexible printed circuit board (referred to as "FPC") including a circuit and a connector for input and output of signals for driving said light source and the high-frequency superposition circuit as well as signals from the light-receiving means, wherein:

the optical pickup device includes a conductive metallic base block, wherein said light source, said light-receiving means and said FPC are held by the base block, and wherein said high-frequency superposition circuit is mounted on said FPC, and said FPC is of two-layered structure with a wiring circuit with parts being mounted thereon and the GND pattern are formed on a first layer while a copper foil surface is formed on a second layer.

10. An optical pickup device, comprising:

a light source for irradiating light onto an optical disk, a light-receiving means for receiving light reflected by the optical disk and converting received optical signals into electric signals, a high-frequency superposition circuit for driving the light source by using a high-frequency superposition method, and a flexible printed circuit board (referred to as "FPC") including a circuit and a connector for input and output of signals for driving said light source and the high-frequency superposition circuit as well as signals from the light-receiving means, wherein:

the optical pickup device includes a conductive metallic base block, wherein said light source, said light-receiving means and said FPC are held by the base block, and wherein said high-frequency superposition circuit is mounted on said FPC, and said optical pickup device includes a conductive metallic base block, and wherein the high-frequency superposition circuit is covered by an HF shielding cover that is fixed to said base block.

11. The optical pickup device as claimed in claim 7, wherein said FPC is fixed to an outer surface of said base block with said reinforcing plate being interposed between.

12. The optical pickup device as claimed in claim 8, wherein said FPC is fixed to an outer surface of said base block with said reinforcing plate being interposed between.

* * * * *